(12) United States Patent
Feng et al.

(10) Patent No.: US 7,955,893 B2
(45) Date of Patent: Jun. 7, 2011

(54) WAFER LEVEL CHIP SCALE PACKAGE AND PROCESS OF MANUFACTURE

(75) Inventors: Tao Feng, Santa Clara, CA (US);
François Hébert, San Mateo, CA (US);
Ming Sun, Sunnyvale, CA (US);
Yueh-Se Ho, Sunnyvale, CA (US)

(73) Assignee: Alpha & Omega Semiconductor, Ltd, Hamilton (BM)

( * ) Notice: Subject to any disclaimer, the term of this patent is extended or adjusted under 35 U.S.C. 154(b) by 542 days.

(21) Appl. No.: 12/023,921

(22) Filed: Jan. 31, 2008

(65) Prior Publication Data

US 2009/0194880 A1    Aug. 6, 2009

(51) Int. Cl.
*H01L 21/00*    (2006.01)
(52) U.S. Cl. .. 438/106; 438/113; 438/460; 257/E23.061
(58) Field of Classification Search .................. 438/106, 438/113, 460; 257/E23.061
See application file for complete search history.

(56) References Cited

U.S. PATENT DOCUMENTS

| | | | |
|---|---|---|---|
| 6,133,634 A | 10/2000 | Joshi | |
| 6,355,502 B1 * | 3/2002 | Kang et al. | 438/110 |
| 6,469,384 B2 | 10/2002 | Joshi | |
| 6,646,329 B2 | 11/2003 | Estacio et al. | |
| 6,653,740 B2 | 11/2003 | Kinzer et al. | |
| 6,767,820 B2 | 7/2004 | Standing et al. | |
| 2003/0052405 A1 | 3/2003 | Moriguchi | |
| 2003/0067071 A1 | 4/2003 | Cardwell | |
| 2003/0207546 A1 * | 11/2003 | Wajima | 438/462 |
| 2008/0274603 A1 * | 11/2008 | Do et al. | 438/462 |

FOREIGN PATENT DOCUMENTS

| | | |
|---|---|---|
| JP | 09-129867 | 5/1997 |
| WO | WO 01-75961 | 10/2001 |

OTHER PUBLICATIONS

PCT International Search Report dated Jul. 27, 2009 for International Patent Application No. PCT/US2009/032242.

* cited by examiner

*Primary Examiner* — Alexander G Ghyka
*Assistant Examiner* — Leonard Chang
(74) *Attorney, Agent, or Firm* — Joshua D. Isenberg; JDI Patent

(57) ABSTRACT

Power wafer level chip scale package (CSP) and process of manufacture are enclosed. The power wafer level chip scale package includes all source, gate and drain electrodes located on one side of the device, which is convenient for mounting to a printed circuit board (PCB) with solder paste.

18 Claims, 10 Drawing Sheets

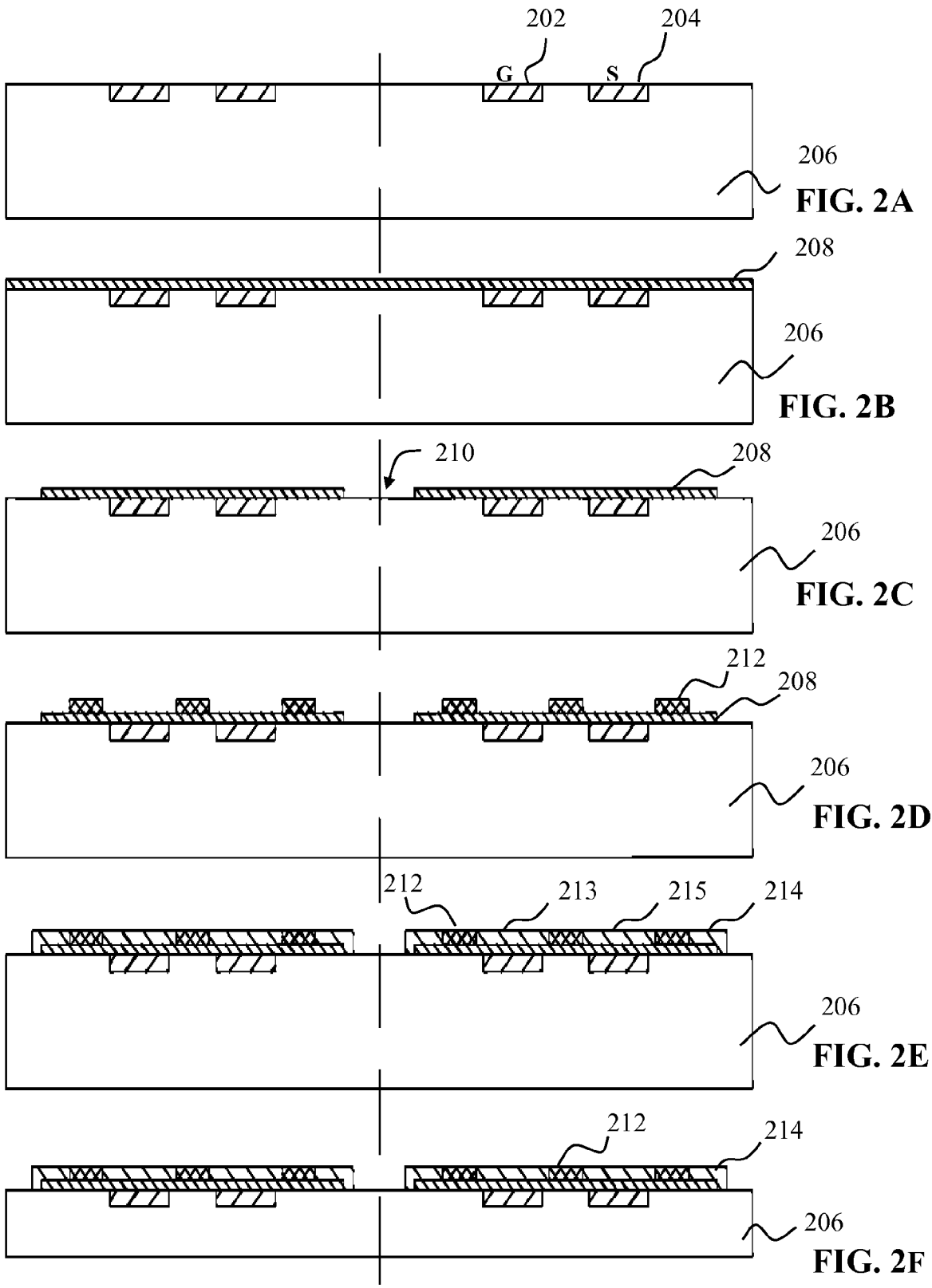

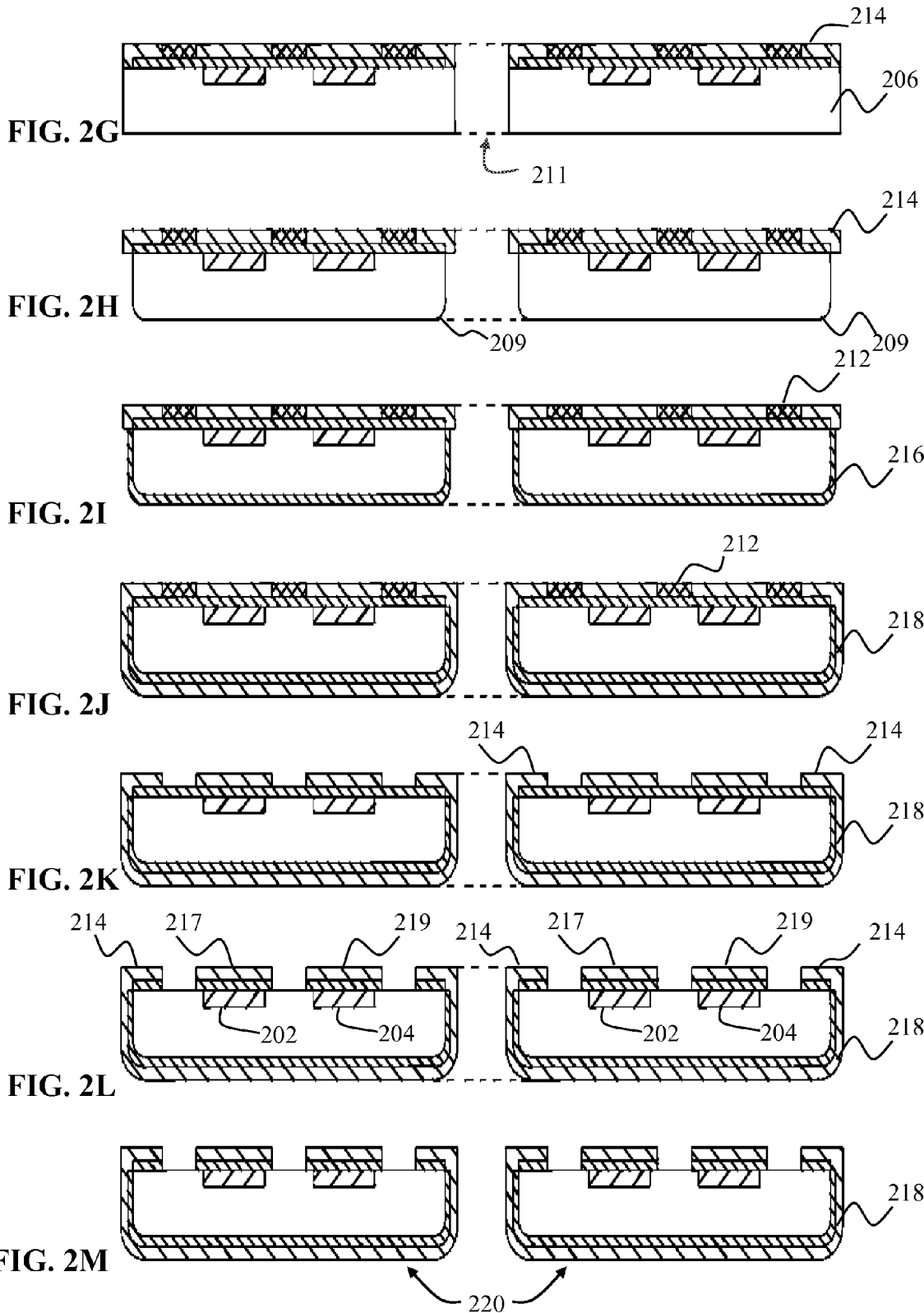

WAFER LEVEL CHIP SCALE PACKAGE AND PROCESS OF MANUFACTURE

FIELD OF THE INVENTION

This invention generally relates to semiconductor packaging and more specifically relates to a low cost process of wafer level chip scale package (WLCSP).

BACKGROUND OF THE INVENTION

A low package resistance and good thermal performance is often desirable for semiconductor devices. This is particularly the case for metal oxide semiconductor field effect transistor (MOSFET) devices, especially vertical conduction power MOSFET devices having gate and source electrodes on one surface of a semiconductor chip and a drain electrode on the opposite surface. It is also generally desirable to have simple, quick and efficient methods of packaging semiconductor devices. Thus, numerous packaging concepts and methods have been developed in the prior art.

While silicon process technology has advanced significantly in the past decade, for the most part, the same decades-old packaging technology continues as the primary packaging means. Epoxy or solder die attachment along with aluminum or gold wire bonding to a lead frame is still the dominant semiconductor packaging methodology. Advances in semiconductor processing technology, however, have made parasitics (e.g., resistances, capacitances and inductances) associated with conventional packaging techniques more of a performance-limiting factor. In the case of conventional flip chip technology, among other shortcomings, electrical connection to the back side of the die is not easily facilitated. These limitations become quite significant in high current applications such as power switching devices.

U.S. Pat. No. 6,767,820 discloses a chip scale package of semiconductor MOS-gated device. A source side of a MOS-gated device wafer is covered with a passivation layer, preferably a photosensitive liquid epoxy, or a silicon nitride layer, or the like. The material is then dried and the coated wafer is exposed using standard photolithographic techniques to image the wafer and openings are formed in the passivation layer to produce a plurality of spaced exposed surface areas of the underlying source metal and a similar opening to expose the underlying gate electrode of each die on the wafer. The openings in the passivation layer are typically made through to a conventional underlying solderable top metal such as titanium, tungsten, nickel, or silver. After the openings are formed, the wafer is then sawn or otherwise singulated into individual die. The solderable drain side of the die is then connected to a U-shaped or cup-shaped drain clip, using a conductive epoxy or solder, or the like to bond the bottom drain electrode of the die to the drain clip. The bottoms of the legs of the drain clip are coplanar with the source-side surface (that is the tops of the contact projections) of the die. U-shaped clip is usually made of a copper alloy with at least partially plated silver surfaces and is actually very thin. However, connecting dies to individual clips tends to be time consuming compared with wafer level process. In addition, different U-shaped clips are typically needed for different die sizes, and the clips take extra space on the PC board.

US publication number 2003/0052405 discloses a vertical power MOSFET device with the drain electrode formed on the bottom surface of the silicon substrate connected to the lead frame above it whereas the gate electrode and the source electrode exposed to the bottom of the device. The MOSFET device is sealed by a resin, such as epoxy or silicone, such that the MOSFET device and an inner part of the lead frame are covered. On the bottom surface of the MOSFET device, the surface of the resin is approximately flush with surfaces of the lead frame and gate/source electrodes. That is, on the bottom surface of the semiconductor device, the bottom surface of outer lead portions of the lead frame and bottom surfaces of gate/source electrodes are exposed for connection to a conductor land (mount surface) of the mounting substrate. Then the perimeter of these gate/source electrodes is covered by the resin.

U.S. Pat. No. 6,133,634 discloses a flip chip package having a power MOSFET device including a drain terminal, a source terminal and a gate terminal. The drain terminal connects to a conductive carrier and an outer array of solder balls. The source terminal and gate terminal connect to an inner array of solder balls. The conductive carrier and the outer array of solder balls provide electrical connection between the printed circuit board and the drain terminal.

U.S. Pat. No. 6,469,384 discloses a method of packaging semiconductor devices, such as MOSFET device, which does not require a molded body. The MOSFET device is coupled to a substrate such that the source and gate regions of the die are coupled to the substrate. The MOSFET device is placed on a printed circuit board (PCB) and the surface of the die is coupled directly to the PCB with solder paste or suitable electrically conductive interconnect, and thus serves as the drain connection. The surface of the die coupled to the substrate comprises the gate region and the source region of the die. Thus, the solder ball in the gate region of the substrate serves to couple the gate region of the die to the PCB while the remaining solder balls couple the source region of the die through the substrate to the PCB.

The preceding prior art package designs for vertical power MOSFET devices can provide electrical interconnection for source, gate and drain for individual MOSFETs. However, additional assembly steps are needed after a wafer has been singulated into individual dies, which increases costs and fabrication time. In addition, the use of metal clips to provide drain contacts from the back to front sides of the die can reduce the available space for the die on a PCB. It would be desirable to produce a package design and process for its manufacture which permits wafer level processing with lower costs and a reduced footprint for individual part.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

Figure 1A:
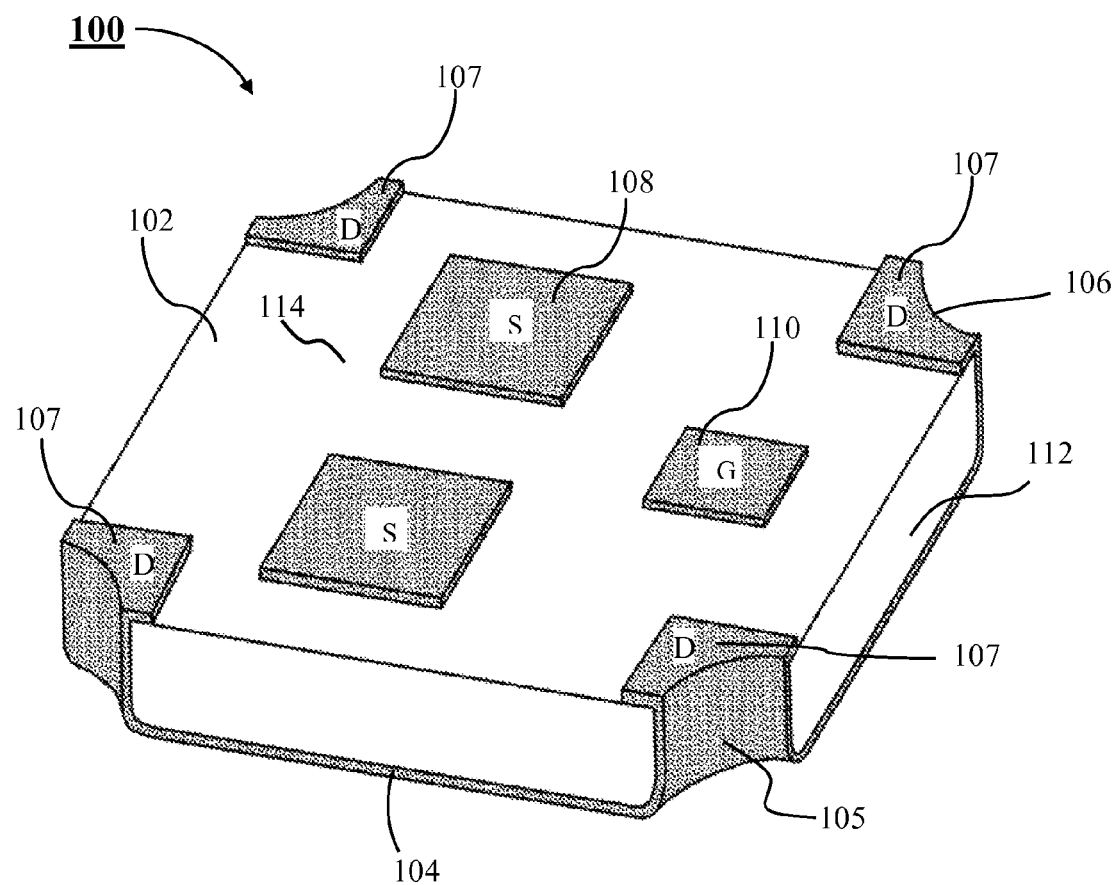
FIG. 1A is a perspective view from a front side (source and gate side) of a semiconductor device according to an embodiment of the present invention.
Figure 1B:
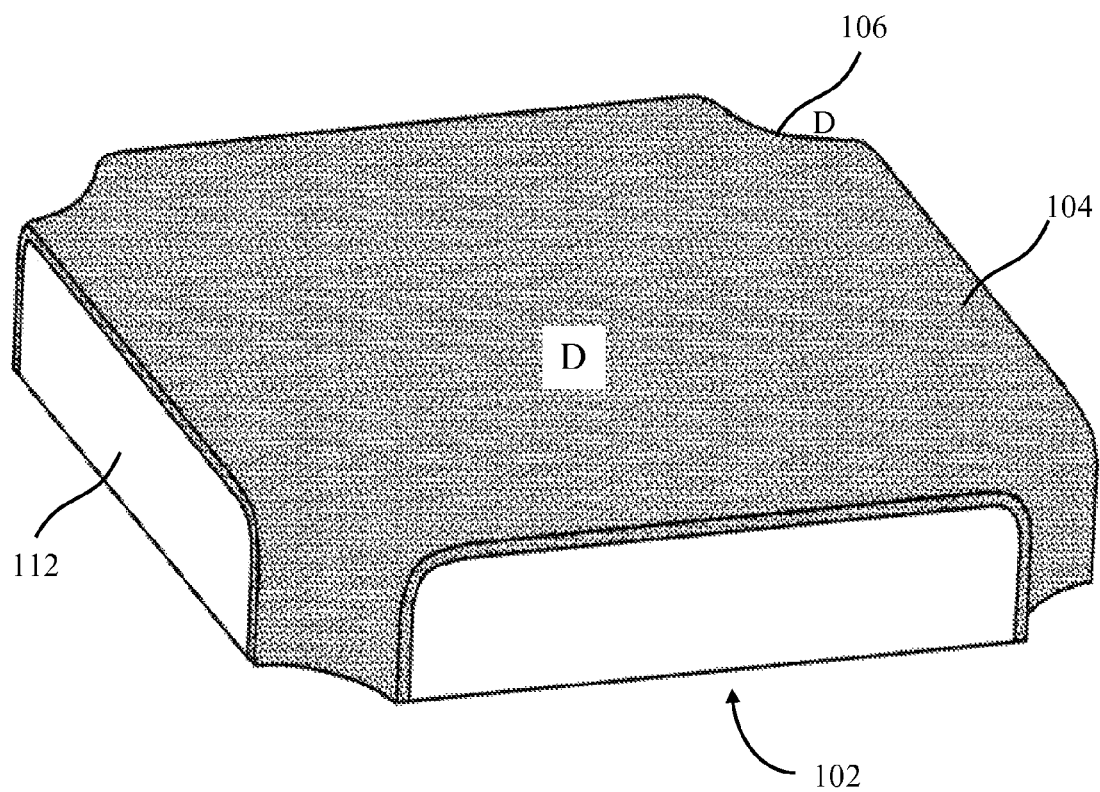
FIG. 1B is a perspective view form a back side (drain side) of the semiconductor device of FIG. 1A.
Figure 1C:
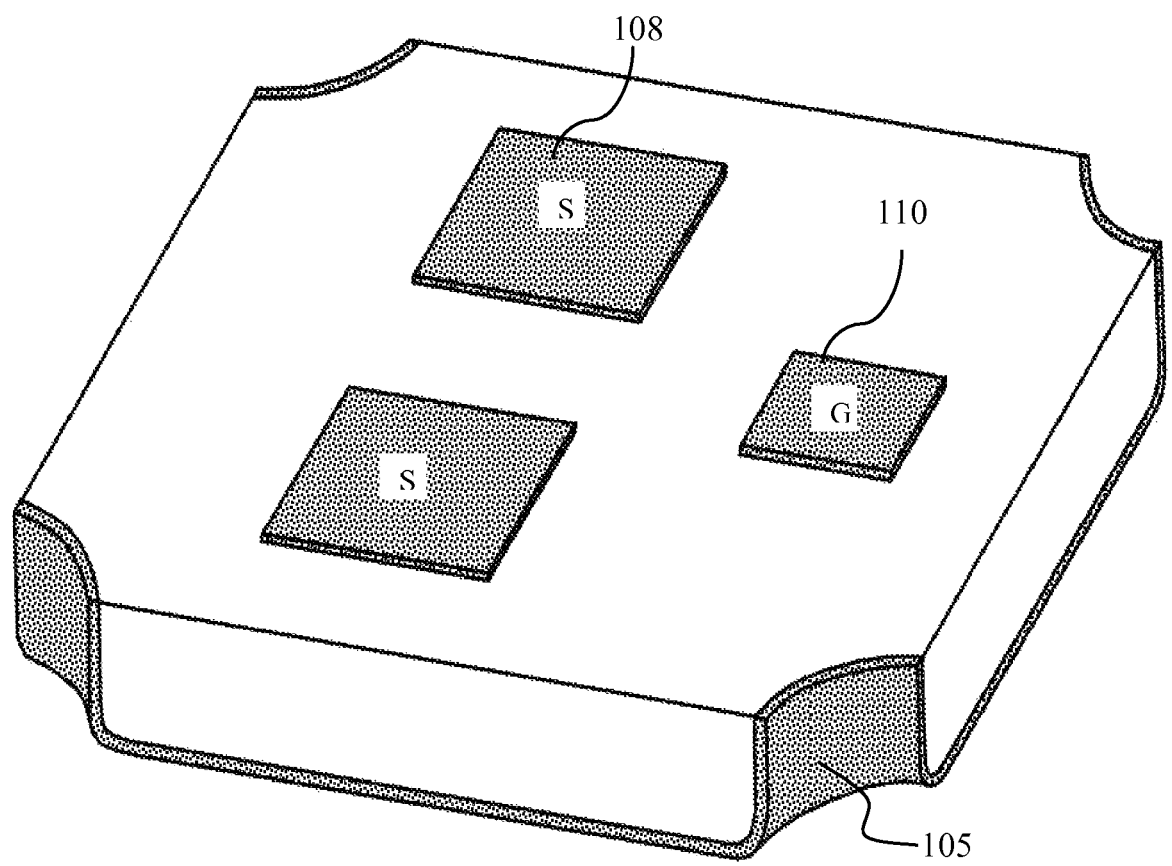
FIG. 1C is a perspective view of an alternative configuration for the front side of a semiconductor device according to an embodiment of present invention.

FIGS. 1A-1B are perspective views from the front side and the back side of a semiconductor device 100 according to a preferred embodiment of the present invention. By way of example, the device 100 may be a vertical power MOSFET. As shown in FIG. 1A, source electrodes (S) 108 and gate electrode (G) 110 are located at the front side of the device 100, connecting to an underlying source pad and a gate pad through opening windows on a passivation layer 102, which is deposited on a substrate 112 made of a semiconductor material, such as silicon. The source pad and gate pad are connected to the source regions and gate regions on the front side of the vertical power MOSFET with a drain region normally located at the backside of the device 100. In the embodiment shown in FIG. 1A, drain electrodes (D) 107 may be located at the trimmed corners 106 at the front side of the device 100. The drain electrodes (D) 107 are electrically connected to a drain region proximate the backside of the device 100 by an electrically conductive layer 104 on the backside and over the sidewalls 105 of the substrate 112 at the trimmed corners 106 as shown in FIGS. 1A-1B. The conductive layer 104 may be formed by selectively electroplating portions of the device 100 with metal, such as copper, or by electrolessly plating selected portions of the device 100 with a metal combination such as nickel/gold (Ni/Au). NiAu comprises of a layer of nickel with a relatively thin layer of gold on it to prevent oxidation. The drain electrodes 107 may be configured such that they extend over a portion of active device area 114 of the device covered by passivation at the front side. Such a configuration may minimize the loss of active device area and also allow for larger area and lower resistance in the source electrodes 108 and gate electrodes 110. In some embodiments the drain electrodes 107 may be omitted and electrical connection to the drain region may be made through the conductive layer 104 on the side-walls of the trimmed corners 105 as shown in FIG. 1C.

Figure 2N:
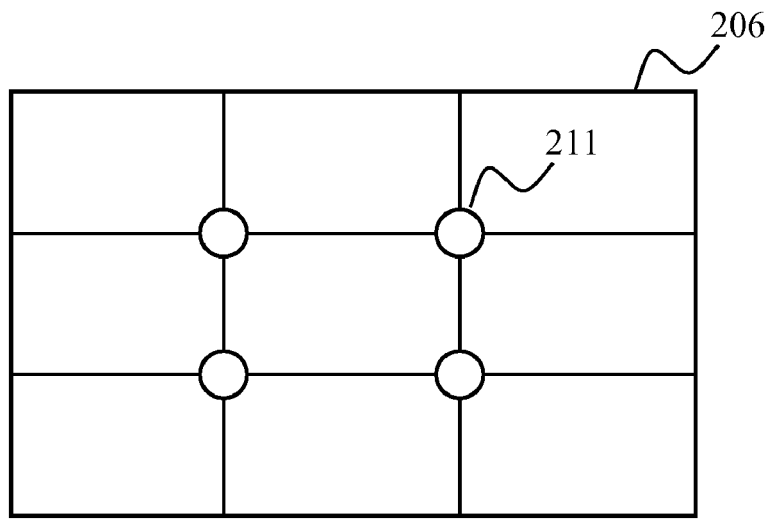
FIGS. 2A-2Q are schematic diagrams showing a process of manufacturing of wafer level chip scale package of vertical power MOSFET of FIGS. 1A-1B according to an embodiment of the present invention.
Figure 2O:
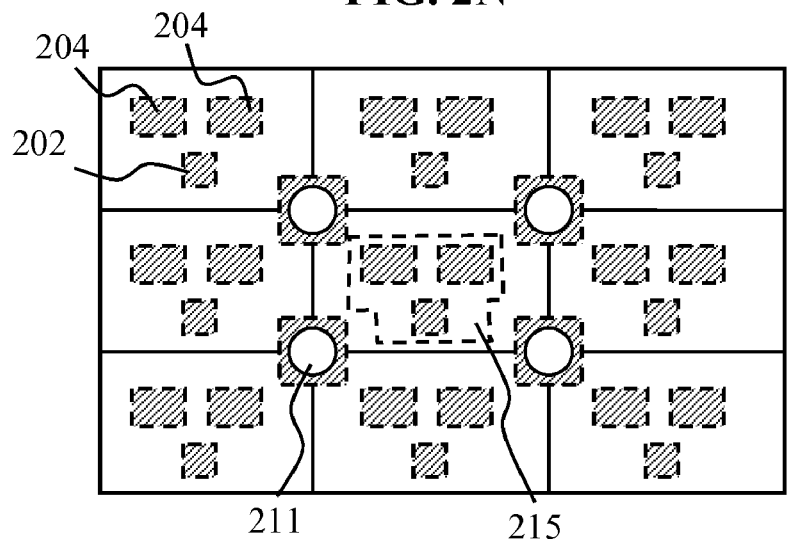
Figure 2P:
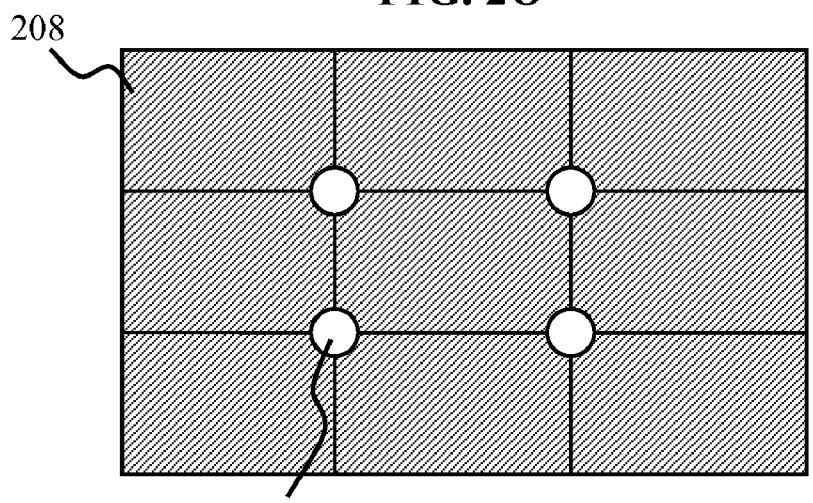

FIGS. 2A-2P are schematic diagrams illustrating an example of a process for wafer-level chip scale packaging of semiconductor devices (e.g., vertical power vertical power MOSFETs) of the type described in FIGS. 1A-1B. As shown in FIG. 2A, processing may start with a substrate 206 with a plurality device structures fabricated on it. By way of example, the substrate 206 may be a semiconductor wafer, such as a silicon wafer, comprising a plurality of semiconductor dies. A passivation layer (not shown) may be deposited on the substrate 206, with gate pads (G) 202 and source pads (S) 204 exposed through window openings on the passivation layer at the top surface of the wafer. A metal seed layer 208 is deposited on selected portions of the top surface of the substrate 206 over the gate areas (G) 202 and source areas (S) 204 as shown in FIG. 2B. The seed layer 208 may be a thin metal layer or metal alloy layer compatible to the metal material to be deposited over it. By way of example, in a case where copper (Cu) is to be used as an electrode material, the seed layer 208 may be formed by a layer of TiCu with thickness less than 4 µm. Holes 210 are formed in seed layer 208 as shown in FIG. 2C by etching through a mask. As shown in FIG. 2D, photo resist mask 212 is deposited on the seed layer 208. The resist layer 212 may be patterned with openings over the gate pads 202 and the source pads 204. A thick metal layer 214 may be plated on the seed layer 208 to form gate electrodes 213 and source electrodes 215 as shown in FIG. 2E. By way of example, copper (Cu) may be electrically plated over the seed layer 208 with thickness larger than 1 µm, preferably larger than 10 µm at the openings in the resist layer 212. The substrate 206 may then be back grinded to a desired thickness as shown in FIG. 2F, preferably less than 400 µm.

After back grinding, one or more through holes 211 may be etched through the substrate 206 as shown in FIG. 2G, e.g., using photo resist 212 and a thick metal layer 214 as mask. FIG. 2N is a top or bottom view of the wafer with through holes 211 as described in FIG. 2G. The substrate 206 may then be isotropically etched, e.g., by an isotropic Si etch followed by oxide etch (wet bench), to form rounded edges 209 of the through holes 211 at the back side of the substrate 206 as shown in FIG. 2H. This increases mechanical strength and improves uniformity of a conductive layer to be formed on the back surface and inside wall of the through holes 211 in subsequent steps. A metal seed layer 216 is formed on the back of the substrate 206 and side-walls of the through the holes 211 as shown in FIG. 2I.

A thick layer of metal 218, e.g., Cu may be plated over the seed layer 216 as shown in FIG. 2J. Photo resist 212 is then removed follow by etching of the seed layer 208 as shown in FIGS. 2K-2L to form isolated gate electrodes 217 and source electrodes 219 over the gate pad 202 and source pad 204 respectively. FIGS. 2O-2P are top and bottom views of the wafer as described in FIG. 2L. As shown in FIG. 2O, drain electrode(s) 214 are located at the corners of each MOSFET structure and partially cover some of the active area 215 of the device. The drain electrodes 214 are electrically connected to drain regions proximate the back side of the substrate 206 by the layer of metal 218 coating the back side and the side walls of the holes 211.

The wafer may then be diced to form individual devices 220 as shown in FIG. 2M. The dicing process cuts through the holes 211 but leaves a portion of the sidewalls of the holes and a corresponding portion of the metal layer 218 coating the sidewalls, which provide electrical interconnections between a backside drain region and the drain electrodes 214.

Figure 2Q:
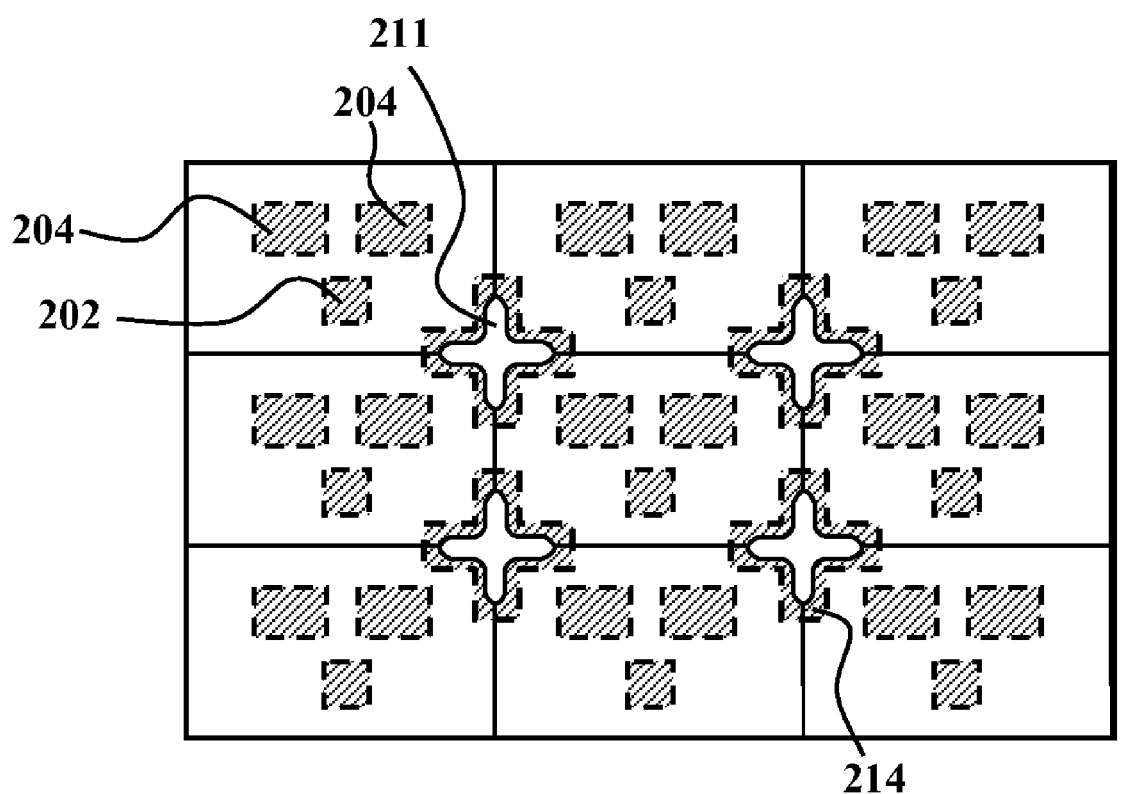

The through holes 211 are not restricted to circular profiles. For example, FIG. 2Q shows an alternative embodiment of the invention in which the through holes 211 have a non-circular profile, but instead are "plus sign"-shaped. Other profiles for the through holes 211 are within the scope of embodiments of the present invention.

Figure 3A:
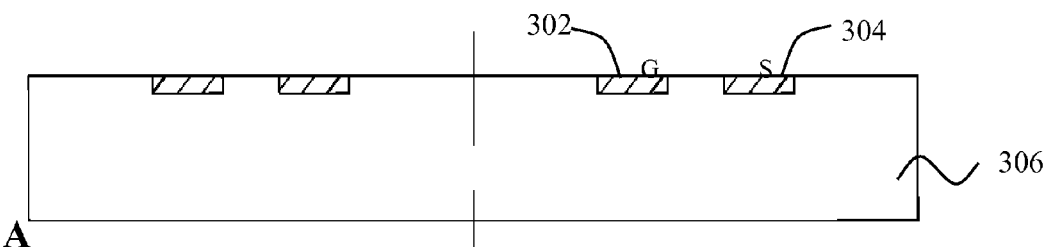
FIGS. 3A-3I are schematic diagrams showing an alternative process of manufacturing of wafer level chip scale package of vertical power MOSFET of FIG. 1C according to another embodiment of the present invention.

FIGS. 3A-3I are schematic diagrams illustrating an alternative process of manufacturing power wafer level chip scale packaging of semiconductor devices. As shown in FIG. 3A, a wafer, which includes a plurality of device structures (e.g., vertical power MOSFETs) includes a semiconductor substrate 306. A passivation layer (not shown) may be deposited on the silicon substrate 306 with gate pads (G) 302 and source pads (S) 304 exposed through opening windows on the passivation layer at the top surface of the wafer.

Figure 3B:
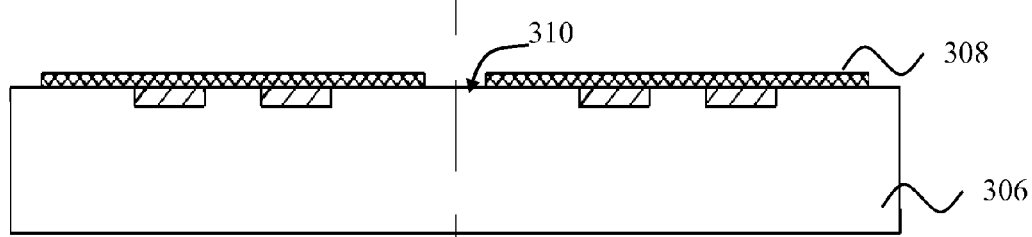
Figure 3C:
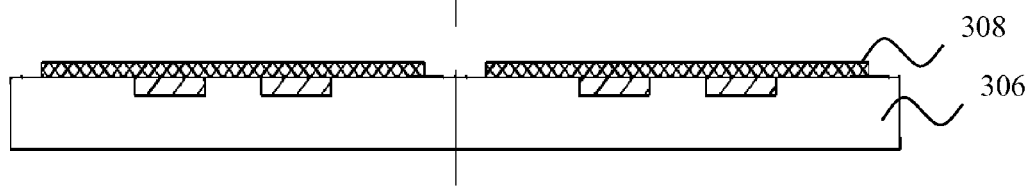

A photo resist mask 308 is deposited on the top surface of the wafer over the gate areas (G) 302 and source areas (S) 304 with holes 310 located at corner intersections between two or more structures as shown in FIG. 3B. The substrate 306 may then be back grinded to a desired thickness as shown in FIG. 3C.

Figure 3D:
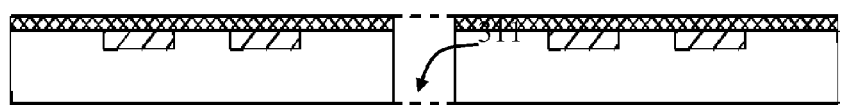
Figure 3E:
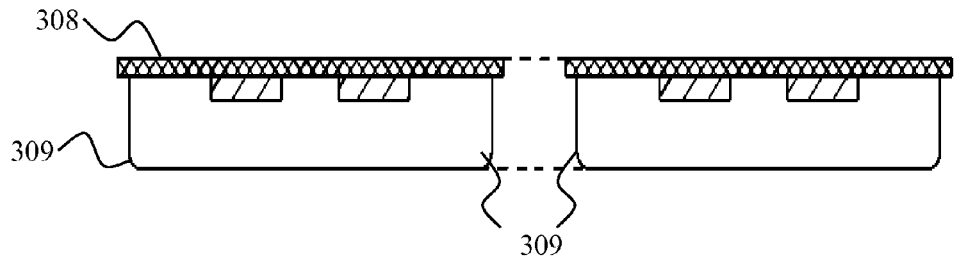
Figure 3F:
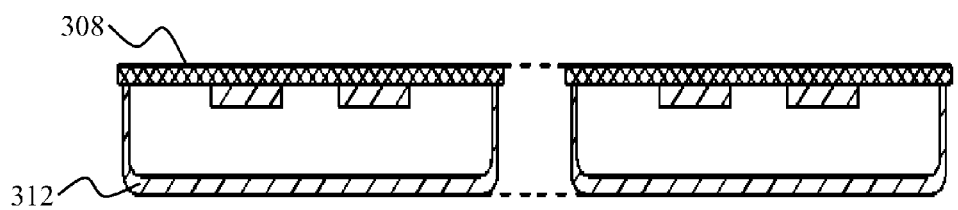
Figure 3G:
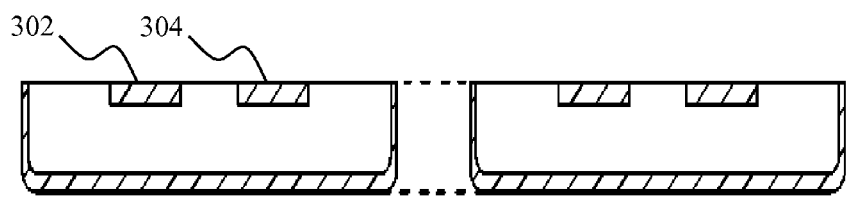
Figure 3H:
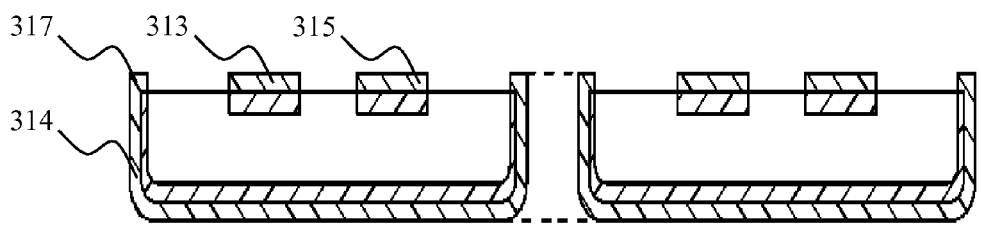
Figure 3I:
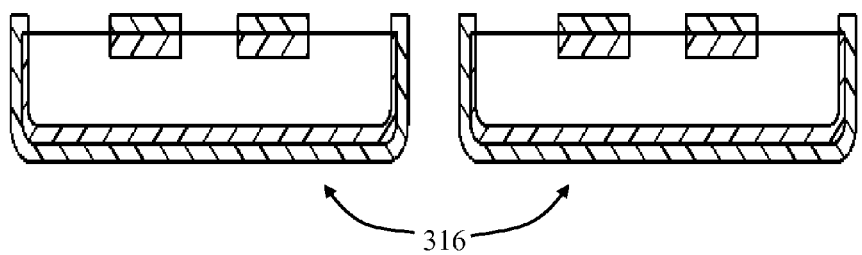

The substrate 306 is etched through holes 310 to form through holes 311 as shown in FIG. 3D. The silicon 306 is then isotropically etched, e.g., using a silicon etch followed by an oxide etch (wet bench), to form rounded edges 309 of the holes 311 at the back side as shown in FIG. 3E. A first metal layer 312 is formed on the back side of the substrate 306 and through the holes 311 coating the side walls of the holes 311 as shown in FIG. 3F. By way of example, the first metal layer 312 may be any metal suitable for electroless Nickel plating, such as an Al or Al alloy deposited over a thin Ti layer. The combined thickness of the first metal layer 312 may be larger than 1 µm, preferably larger than 3 µm. After the first metal layer 312 is formed, the photo resist mask 308 is then removed as shown in FIG. 3G. A second metal layer 314, such as electroless Ni/Au, is electrolessly plated over the first metal layer 312, as shown in FIG. 3H. By way of example, the Ni thickness may be between 1-10 µm and the Au thickness may be less than 1 µm, with a total combined thickness less than 11 µm. The process that forms the second metal layer 314 may be one in which metal grows on the gate pads 302, source pads 304 and over the metal layer 312 to form gate electrodes 313, source electrodes 315 and drain electrodes 317. The wafer is finally diced to form individual vertical power MOSFET 316 as shown in FIG. 3I.

By contrast, in a conventional process, the front side, which includes gate and source electrodes, is normally plated separately from the back side, so the back side needs to be protected during front side metal deposition and different metal is used for front and back sides. Normally, an Al—Si—Cu alloy is used on front side. Al is normally not used on back side since it is difficult to solder when mounting to a PC board. In the forgoing embodiments, by contrast, the same metal may be used for the source, gate and drain connections. This simplifies the manufacturing and reduces the cost.

Figure 4A:
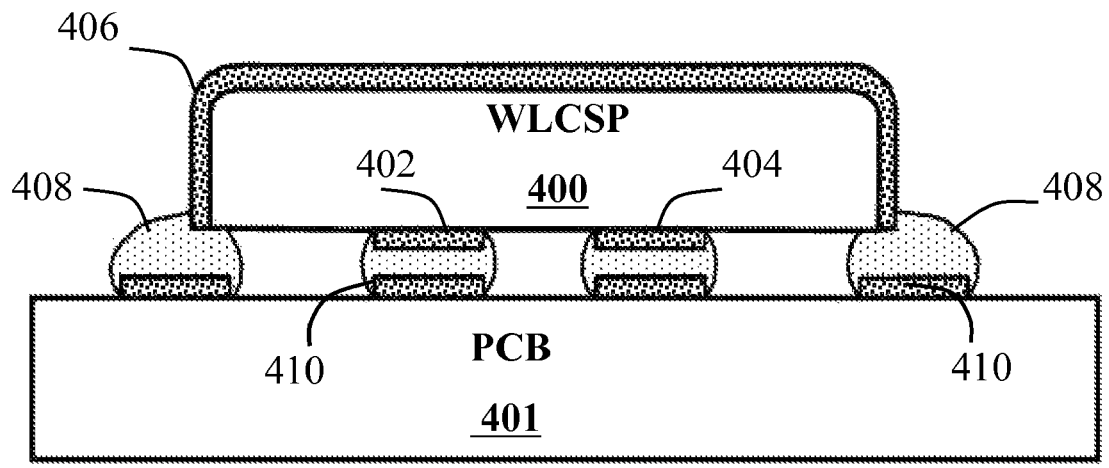
FIGS. 4A-4B are schematic diagrams illustrating a method for mounting a vertical power MOSFET of the type shown in FIG. 1C to a PC board.
Figure 4B:
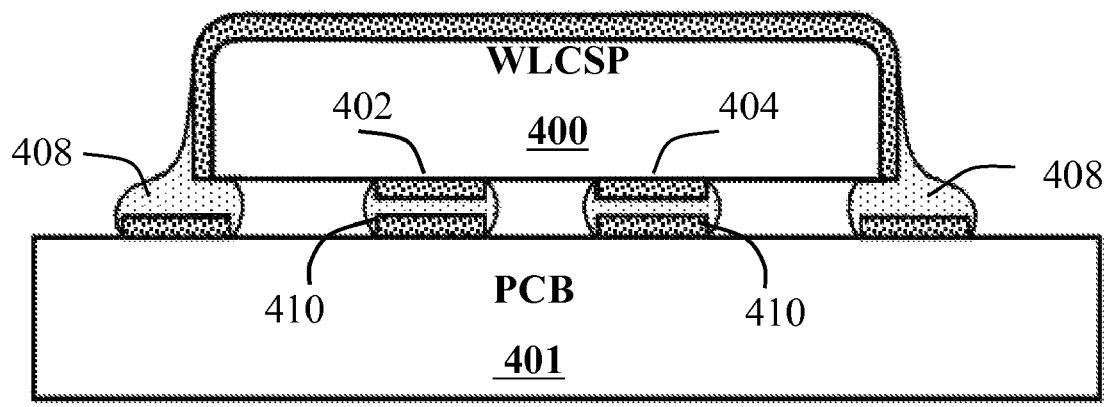

FIGS. 4A-4B are schematic diagrams showing the steps of mounting a power wafer level chip package scale vertical power MOSFET of the type in FIG. 1C to a printed circuit board (PCB).

As shown in FIG. 4A, a WLCSP device 400 of the type depicted in FIG. 1C having a front side gate electrode 402, source electrode 404 and side wall drain electrode 406 may be bonded to a PC board 401. Solder paste 408 may be deposited at the electrodes 410 of the PCB 401 followed by flip-chip mounting the device on to the PCB. The solder paste 408 is then reflowed to form electrical interconnection between the gate electrode 402, source electrode 404, drain electrode 406 and corresponding electrodes 410 of the PCB 401 as shown in FIG. 4B. The solder paste 408, after reflow, may also wet the drain metal electrode 406 on the side walls at the trimmed corners, which results in a small resistance.

Embodiments of the present invention avoid the use of metal contacts, such as caps or other structures, or post singulation manufacturing steps to provide contact between the front and back sides of a semiconductor device chip. Embodiments of the present invention allow electrical contact to be made between front and back sides of a semiconductor device while the device is still part of a wafer and before the wafer is singulated into individual device chips. Embodiments of the present invention facilitate simple, efficient and cost effective wafer level chip scale packaging of semiconductor devices.

Although the specification shows a vertical power MOSFET, this invention is also applicable to any type of vertical semiconductor device, such as an insulated-gate bipolar transistor (IGBT), a bottom source MOSFET, or a bipolar power transistor.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for manufacturing a plurality of semiconductor devices, comprising:
   a) providing a wafer comprising a plurality of semiconductor dies, wherein each semiconductor die in the plurality of semiconductor dies comprises first, second, and third regions, wherein a first pad electrically connected to the first region, a second pad electrically connected to the second region, wherein the first region and second region are located at a front surface of the wafer, and wherein the third region is located at a back surface of the wafer;
   b) forming through holes through the wafer at corner intersections between semiconductor dies of the plurality of semiconductor dies; and
   c) depositing a conductive layer on the back surface of the wafer and on side walls of the through holes reaching the front surface of the wafer while covering the top surface of the wafer with a mask.

2. The method of claim 1, further comprising: after c) dicing the wafer to form individual semiconductor devices.

3. The method of claim 1, wherein b) includes:
   depositing a photo-resist mask over the front surface of the wafer, wherein the photo-resist mask includes a plurality of holes, wherein each hole is located at the corner intersections between semiconductor dies; and
   etching the wafer through the holes in the photo-resist mask to form the plurality of through holes through the wafer.

4. The method of claim 3, further comprising removing the photo-resist mask.

5. The method of claim 1, further comprising grinding the wafer from the back surface to a desired thickness.

6. The method of claim 1, further comprising: after b) isotropically etching the wafer to form rounded edges of the through holes at the back surface of the substrate.

7. The method of claim 1, wherein the conductive layer comprises electrolytically plated copper.

8. The method of claim 1, further comprising: after b) depositing a seed layer on the back side surface of the wafer and the side walls of the through holes.

9. A method for manufacturing a plurality of semiconductor devices, comprising:
   a) providing a wafer comprising a plurality of semiconductor dies, wherein each semiconductor die in the plurality of semiconductor dies comprises first, second, and third regions, wherein a first pad electrically connected to the first region, a second pad electrically connected to the second region, wherein the first region and second region are located at a front surface of the wafer, and wherein the third region is located at a back surface of the wafer;

b) depositing a seed layer on the front surface of the wafer;

c) forming a plurality of holes on the seed layer, wherein each hole is located at the corner intersections between semiconductor dies in the plurality of semiconductor dies;

d) forming through holes through the wafer at corner intersections between semiconductor dies; and e) forming a conductive layer on the back surface of the wafer and on side walls of the through holes reaching the front surface of the wafer.

10. The method of claim 9, further comprising electrolytically plating the seed layer with copper.

11. The method of claim 10, further comprising etching back the seed layer.

12. The method of claim 9, wherein the conductive layer comprises electrolytically plated copper.

13. The method of claim 9, further comprising: after d) depositing a seed layer on the back side surface of the wafer and the side walls of the through holes.

14. The method of claim 9, wherein d) includes:
depositing a photo-resist mask over the front surface of the wafer, wherein the photo-resist mask includes a plurality of holes, wherein each hole is located at the corner intersections between semiconductor dies; and
etching the wafer through the holes in the photo-resist mask to form the plurality of through holes through the wafer.

15. The method of claim 14, further comprising removing the photo-resist mask.

16. The method of claim 9, further comprising grinding the wafer from the back surface to a desired thickness.

17. The method of claim 9, further comprising: after d) isotropically etching the wafer to form rounded edges of the through holes at the back surface of the substrate.

18. The method of claim 9, further comprising: after e) dicing the wafer to form individual semiconductor devices.

* * * * *